United States Patent
Lee et al.

(10) Patent No.: US 9,201,245 B2
(45) Date of Patent: Dec. 1, 2015

(54) OPTICAL SYSTEM AND SUBSTRATE SEALING METHOD

(71) Applicants: Jung-Min Lee, Yongin (KR); Young-Kwan Kim, Yongin (KR)

(72) Inventors: Jung-Min Lee, Yongin (KR); Young-Kwan Kim, Yongin (KR)

(73) Assignees: SAMSUNG DISPLAY CO., LTD., Yongin, Gyeonggi-do (KR); LIS CO., LTD., Uiwang-si, Gyeonggi-do (KR)

(*) Notice: Subject to any disclaimer, the term of this patent is extended or adjusted under 35 U.S.C. 154(b) by 305 days.

(21) Appl. No.: 13/858,200

(22) Filed: Apr. 8, 2013

(65) Prior Publication Data

US 2014/0177077 A1   Jun. 26, 2014

(30) Foreign Application Priority Data

Dec. 21, 2012   (KR) ........................ 10-2012-0151345

(51) Int. Cl.

| H01L 27/32 | (2006.01) |
|---|---|
| H01L 51/52 | (2006.01) |
| G02B 27/09 | (2006.01) |
| B23K 26/00 | (2014.01) |
| G02B 13/00 | (2006.01) |
| H05B 33/04 | (2006.01) |
| G06F 3/041 | (2006.01) |
| H01L 21/64 | (2006.01) |
| B23K 26/20 | (2014.01) |

(52) U.S. Cl.
CPC ............ *G02B 27/0988* (2013.01); *B23K 26/00* (2013.01); *G02B 13/0095* (2013.01); *H01L 27/32* (2013.01); *H01L 51/52* (2013.01); *B23K 26/203* (2013.01); *B23K 26/206* (2013.01); *G06F 3/041* (2013.01); *H01L 21/64* (2013.01); *H01L 2224/40145* (2013.01); *H05B 33/04* (2013.01)

(58) Field of Classification Search
CPC .................... H01L 21/64; H01L 2224/40145; H01L 27/32; H01L 51/52; G06F 3/041; H05B 33/04; B23K 26/203; B23K 26/206
USPC ......... 445/24, 25; 65/36–58, 59.1; 156/272.8; 219/121.66, 121.73, 121.85; 438/27, 438/29, 82, 99; 501/15; 313/512; 345/173
See application file for complete search history.

(56) References Cited

U.S. PATENT DOCUMENTS

| 4,724,219 | A | * | 2/1988 | Ridinger ........................ 438/535 |
|---|---|---|---|---|
| 7,597,603 | B2 | * | 10/2009 | Becken et al. .................. 445/24 |
| 7,807,009 | B2 | * | 10/2010 | Lee et al. ....................... 156/283 |
| 8,175,124 | B2 | * | 5/2012 | Lee et al. ............................ 372/9 |
| 8,245,536 | B2 | * | 8/2012 | Logunov et al. .................. 65/43 |

FOREIGN PATENT DOCUMENTS

| KR | 10-2009-0065038 A | 6/2009 |
|---|---|---|
| KR | 10-2012-0056605 A | 6/2012 |
| KR | 10-2012-0069302 A | 6/2012 |

* cited by examiner

*Primary Examiner* — Samuel M Heinrich
(74) *Attorney, Agent, or Firm* — Lee & Morse, P.C.

(57) ABSTRACT

An optical system includes an enlarging optical system that enlarges a section of an incident light, a mask that passes some of a light passing through the enlarging optical system, and a reduction optical system that reduces a section of a light passing through the mask.

10 Claims, 5 Drawing Sheets

OPTICAL SYSTEM AND SUBSTRATE SEALING METHOD

CROSS-REFERENCE TO RELATED PATENT APPLICATION

This application claims priority under 35 U.S.C. §119 to Korean Patent Application No. 10-2012-0151345, filed on Dec. 21, 2012, in the Korean Intellectual Property Office, the disclosure of which is incorporated herein in its entirety by reference.

BACKGROUND

1. Field

Embodiments relate to an optical system and a substrate sealing method.

2. Description of the Related Art

Recently, portable thin flat panel display devices have been used extensively as display devices. An electroluminescent display device is a self-light emitting type display device that has received attention as a next-generation display device due to its wide viewing angle, excellent contrast, and fast response rate. In addition, an organic light-emitting display device, in which an emissive layer is formed of an organic material, has advantages of excellent brightness, driving voltage, response rate properties, and the ability to provide a polychromatic image, compared to an inorganic light-emitting display device.

A typical organic light-emitting display device has a structure in which at least one organic layer, including an emissive layer, is interposed between a pair of electrodes.

SUMMARY

Embodiments are directed to an optical system including an enlarging optical system that enlarges a section of an incident light, a mask that passes some of a light passing through the enlarging optical system, and a reduction optical system that reduces a section of a light passing through the mask.

A light passing through the reduction optical system may be irradiated in the form of a spot beam.

A light passing through the reduction optical system may be irradiated to a sealing portion arranged between first and second substrates and may be used for sealing the first and second substrates.

The mask may include a pattern in a predefined shape and may block some of the light passing through the enlarging optical system.

An intensity of a light on a surface of the mask may be about 0.1 W/mm² to about 1 W/mm².

A light passing through the enlarging optical system may have a circular section. The mask may have a pattern in which two opposing sides of the mask are concave symmetrically to a central line of a light passing through the mask. A section of a light passing through the mask may have a shape in which two opposing sides of the section are concave symmetrically to a central part of the light passing through the mask.

A light passing through the reduction optical system may have a constant beam intensity and may have a beam profile in a shape in which two opposing sides of the beam profile are concave symmetrically to a central line of the light passing through the reduction optical system.

The optical system may further include a driving unit that is coupled to the mask to rotate the mask.

The enlarging optical system may include a first lens that changes the incident light to a parallel light, and a second lens that makes a parallel light passing through the first lens form an image on the mask.

The enlarging optical system may further includes a first mirror that reflects a parallel light passing through the first lens, and a second mirror that reflects a parallel light that is reflected by the first mirror. The traveling direction of the parallel light passing through the first lens may change to an opposite direction as the parallel light is reflected by the first and second mirrors.

The reduction optical system may include a third lens that changes a light passing through the mask to a parallel light, a fourth lens that makes a parallel light passing through the third lens form a focal point, and a final optical unit that reduces a section of a light passing through the fourth lens.

The reduction optical system may include a third mirror that reflects a parallel light passing through the third lens, and a fourth mirror that reflects a parallel light that is reflected by the third mirror. The traveling direction of a parallel light passing through the first third changes to an opposite direction by the reflection by the third and fourth mirrors.

The final optical unit may include at least three lenses.

The fourth lens may be moveable in a direction parallel to a traveling direction of a light passing through the fourth lens.

Embodiments are also directed to a method of sealing a first and a second substrate by irradiating light to a sealing portion arranged between the first and second substrates, including disposing the sealing portion between the first and second substrates, enlarging a section of an incident light, passing light with an enlarged section through a mask, reducing a section of light that has passed through the mask with a reduction optical system, and irradiating light that has passed through the reduction optical system along a sealing line of the sealing portion.

The intensity of a light on the surface of the mask is in a range of about 0.1 W/mm² to about 1 W/mm².

Light that has passed through the reduction optical system is irradiated to the sealing portion in the form of a spot beam.

The enlarging of the section of the incident light may include changing the incident light to a parallel light, reflecting the parallel light, and making the reflected parallel light form an image on the mask.

The method may further include rotating the mask.

The reducing of the section of light that has passed through the mask may include changing the light passing through the mask to a parallel light, reflecting the parallel light, making the reflected parallel light form a focal point through a lens, and reducing a section of light passing through the lens.

The method may further include moving the lens in a direction parallel to the traveling direction of the light passing through the lens.

After focusing a central line of light passing through the reduction optical system on a central line of the sealing line, scanning may be performed along the central line of the sealing portion to irradiate a light passing through the reduction optical system.

A width LW of a light passing through the reduction optical system may be greater than a width of the sealing portion.

The sealing portion may include a frit.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
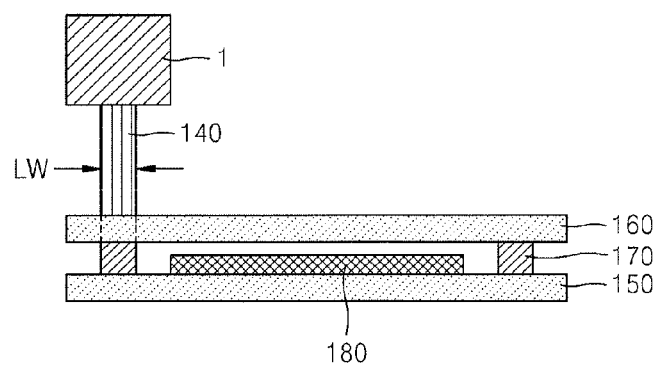
FIG. 1 is a sectional view schematically illustrating a method of sealing with a sealing portion of an organic light-emitting display device by using an optical system, according to an embodiment.

Expressions such as "at least one of," when preceding a list of elements, modify the entire list of elements and do not modify the individual elements of the list.

Specific embodiments will be illustrated in the drawings and described in the detailed description in detail. However, the specific embodiments are not intended to be limiting, but should be understood as including all changes, equivalents and replacements that fall within the spirit and technical scope thereof.

Though terms like 'first' and 'second' may be used to describe various components, the components should not be limited to these terms. The terms are used only for the purpose of distinguishing one component from another component.

The terms used herein are used just to describe specific embodiments and are not intended to be limiting. The terms of a singular form may include plural forms unless being used as explicitly different meaning on the context. It should be understood that the term like "comprises", "includes", or "has" is herein intended to designate that there is a feature, a numeral, a step, an operation, a component, a part or their combination described in the specification and do not exclude one or more other features, numerals, steps, operations, components, parts or their combinations.

Exemplary embodiments will be described in more detail below with reference to the accompanying drawings.

Figure 2:
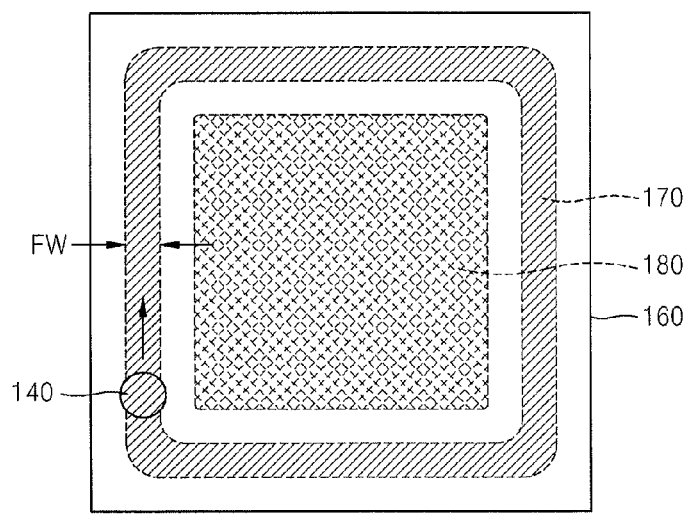
FIG. 2 is a top view of illustrating the method shown in FIG. 1.

FIG. 1 is a sectional view schematically illustrating a method of sealing with a sealing portion 170 of an organic light-emitting display device by using an optical system 1, according to an embodiment, and FIG. 2 is a top view of FIG. 1.

Referring to FIGS. 1 and 2, an organic light-emitting unit 180 and the sealing portion 170 that surrounds the organic light-emitting unit 180 are arranged between a first substrate 150 and a second substrate 160, and a laser beam 140 irradiated from the optical system 1 is irradiated to the sealing portion 170.

The organic light-emitting unit 180 is disposed on the first substrate 150. The first substrate 150 may be a glass substrate.

The second substrate 160 is an encapsulation substrate that encapsulates the organic light-emitting unit 180 disposed on the first substrate 150. The second substrate 160 may be one through which a laser beam to be described below may be transmitted, preferably a glass substrate.

The organic light-emitting unit 180 includes at least one organic light-emitting device (OLED) (not illustrated) that includes at least one organic layer (not illustrated) including an emissive layer between a first electrode (not illustrated) and a second electrode (not illustrated). In this case, the first and second electrodes may function respectively as an anode through which holes are injected and a cathode through which electrodes are injected.

The OLED may be classified as a passive matrix (PM) OLED or an active matrix (AM) OLED depending on whether an OLED is driven by the control of a thin film transistor (TFT). The present embodiment may be applied to any of an AM OLED and a PM OLED.

The sealing portion 170 is disposed on the second substrate 160 to surround the organic light-emitting unit 180 described previously.

The sealing portion 170 may form a closed loop to block the organic light-emitting unit 180 from coming into contact with external moisture or oxygen.

Although each corner of the sealing portion 170 forming the closed loop is curved with certain curvature in the present embodiment, in other implementations, corners of the sealing portion 170 may have an orthogonal shape without curvature.

If corners of the sealing portion 170 have a certain curvature, the laser beam may be irradiated while the optical system 1 continuously scans a sealing line including corners of the sealing portion 170 directly.

On the other hand, if corners of the sealing portion 170 are orthogonal, the laser beam 140 may be irradiated while the optical system 1 scans along a first corner of the sealing portion 170 in a first direction, and then a stage (not illustrated) arranged under the first substrate 150 may be rotated through 90 degrees. If the stage rotates, both the first substrate 150 and the second substrate 160 rotate along with the stage. After the stage has been rotated, the laser beam 140 is irradiated to a second corner of the sealing portion 170 while the optical system 1 irradiates the laser beam 140 by scanning in the first direction described previously. The sealing portion 170 may be sealed by irradiating the laser beam 140 while rotating the stage in this way.

In the present embodiment, frit is used as the sealing portion 170 to protect the organic light-emitting unit 180 more effectively by ensuring the hermeticity of the first substrate 150 and the second substrate 160. The frit is formed to have a given frit width (FW) by screen printing or pen dispensing techniques.

Although in the present embodiment, the sealing portion 170 is disposed on the second substrate 160 and the organic light-emitting unit 180 is disposed on the first substrate 150 to align the first substrate 150 with the second substrate 160, in other implementations, the sealing portion 170 may be disposed on the first substrate 150 with the organic light-emitting unit 180, aligned with the second substrate 160, and then bonded to it.

In addition, although the drawings illustrate that one organic light-emitting unit 180 is disposed, the present embodiment may also be applied to cases where, between the first substrate 150 and the second substrate 160, a plurality of organic light-emitting units 180 and a plurality of sealing portions 170 surrounding the plurality of organic light-emitting units 180 are disposed.

The optical system 1 irradiates the laser beam 140 to the sealing portion 170 arranged between the first substrate 150 and the second substrate 160 along a sealing line, in the form of a spot beam with a beam profile according to the present embodiment, as described in more detail below.

Figure 8:
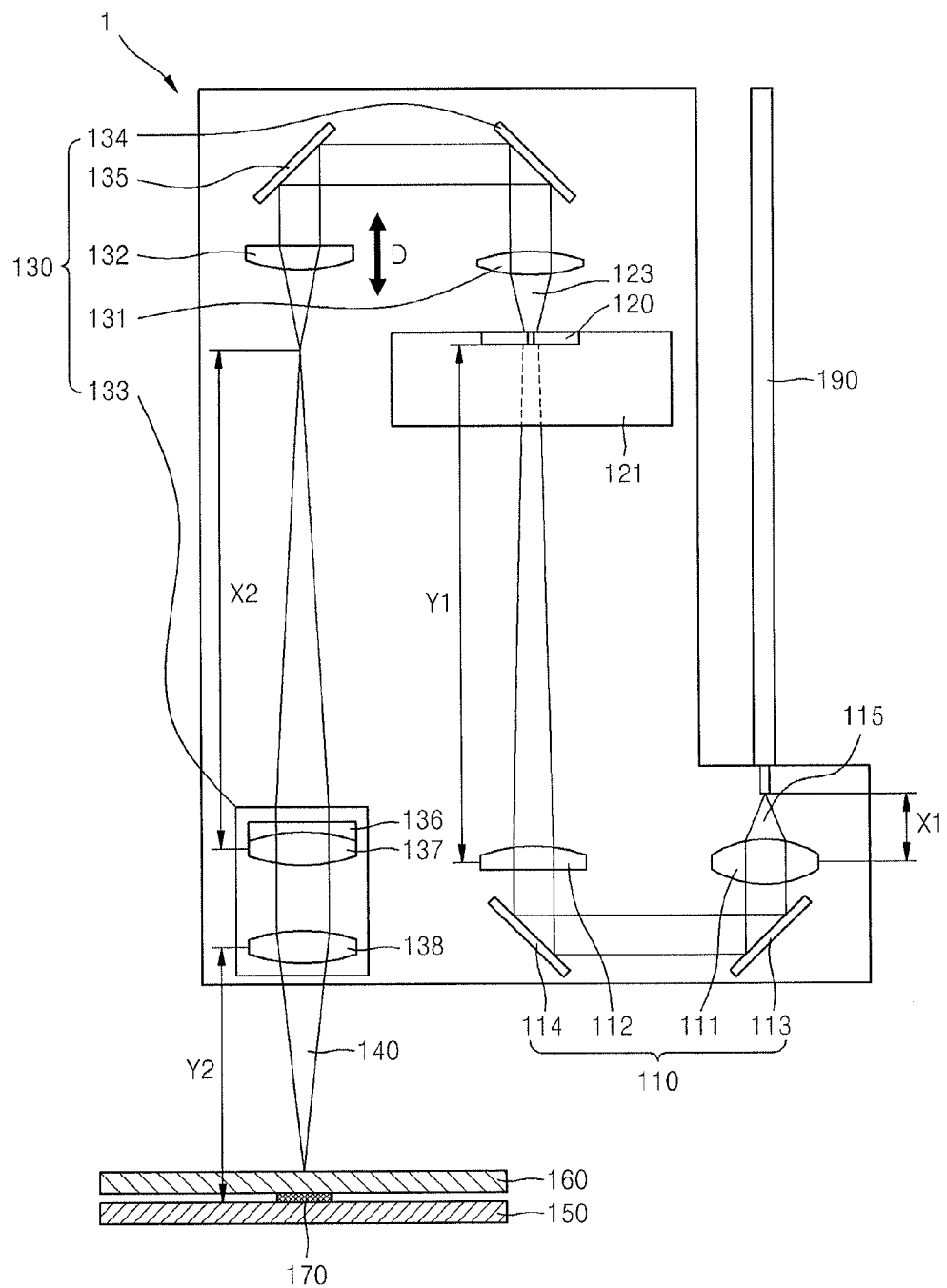
FIG. 8 is a view schematically illustrating an optical system according to an embodiment.

The optical system 1 may be connected to a laser oscillator (not illustrated) generating laser beams through an optical fiber 190 (see FIG. 8). In addition, the optical system 1 may include a beam homogenizer (not illustrated) and a scanner (not illustrated).

The laser oscillator may use a bundle-type multi core source that is a high output laser source generally used for laser sealing.

In the case of the bundle-type multi core source, the outputs of the cores may differ by a little. Such non-homogeneity may be addressed by using the beam homogenizer.

The scanner may include a reflection unit (not illustrated) that reflects the laser beams radiated from the laser oscillator to the sealing portion 170, a driving unit (not illustrated) driving the reflection unit, and a lens unit (not illustrated) concentrating the reflected laser beams.

The laser beam 140 passing through the lens unit is irradiated to the sealing portion 170 in the form of a spot beam with a beam profile according to the present embodiment. In this case, the lens unit may be arranged in the scanner or separately under the scanner to face the sealing portion 170.

Although not illustrated in the drawings, it is possible to adjust the width of the laser beam 140 (LW) irradiated to the width of the sealing portion 170 (FW) by arranging a laser mask (not illustrated) between the optical system 1 and the second substrate 160, if LW is greater than FW.

Figure 3:
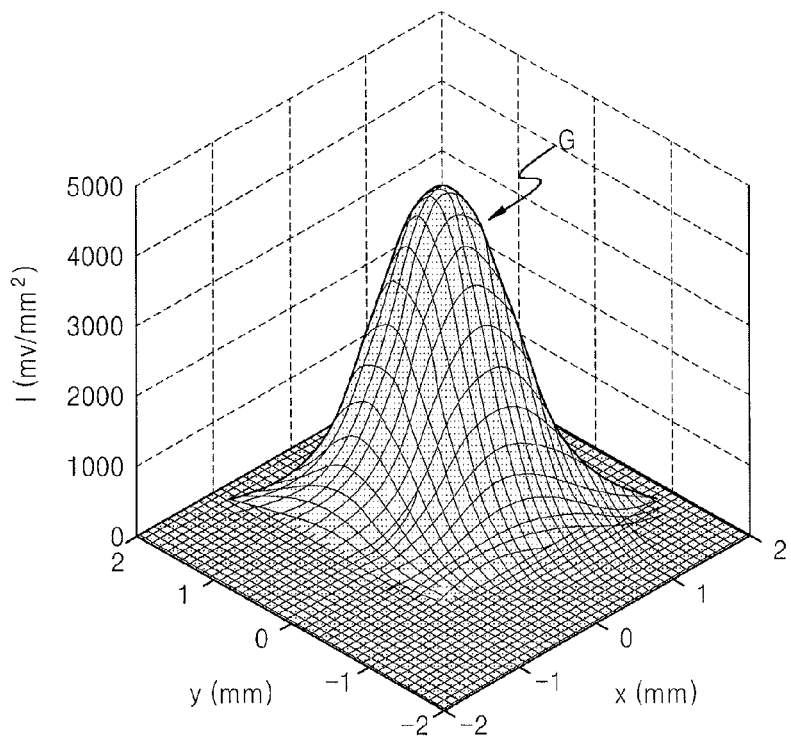
FIG. 3 is a view illustrating a Gaussian beam profile that is a first comparative example for comparison with a beam profile irradiated by an optical system according to the present embodiment.

FIG. 3 is a view illustrating a Gaussian beam profile that is a first comparative example for comparison with a beam profile irradiated by a laser irradiating device according to the present embodiment.

Figure 4:
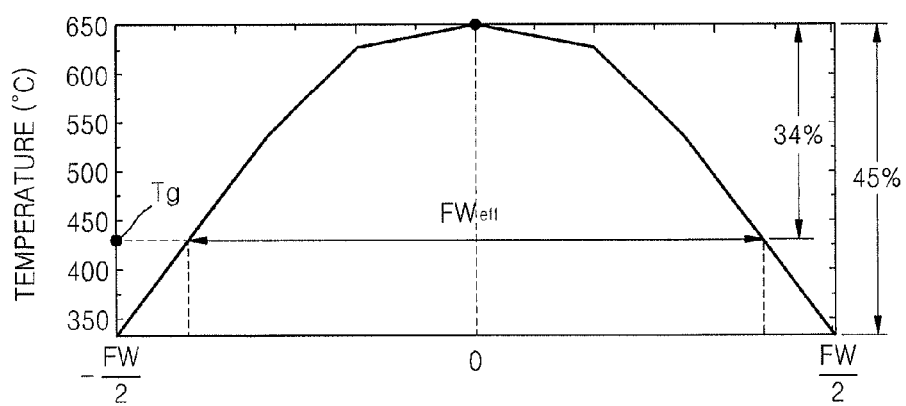
FIG. 4 is a view illustrating a temperature distribution with respect to a section of fit when irradiating the Gaussian beam profile of FIG. 3 to the frit of an organic light-emitting display device.

FIG. 4 is a view illustrating a temperature distribution with respect to a section of frit when irradiating the Gaussian beam profile of FIG. 3 to the frit of an organic light-emitting display device.

Referring to FIG. 3, a laser beam profile G with a Gaussian distribution increases in beam intensity I per unit area near the central part of a beam and has axis symmetry distribution.

The axes x and y on the plane of FIG. 3 represent the width and height of a beam profile. Even if only a part near the central axis of the laser beam profile G is cut with a laser mask for use, the beam intensity difference between the central part of the laser beam profile G and the peripheral part of the laser beam profile G cut by the laser mask may be about 15% or more.

If frit that forms a sealing portion and a laser beam with the beam intensity difference between the central part and peripheral part of a beam is irradiated, the temperature difference between the central part of the frit (corresponding to a point where the horizontal axis is 0) and the edges of the fit (corresponding to a point where the horizontal axis is ±FW/2) may be about 45% or more. The temperature difference between the central part and the edges of the frit within an effective sealing width (FW$_{eff}$) corresponding to about 80% of the whole FW may be up to about 34%, as illustrated in FIG. 4.

In such a case, the laser output may be increased so as to maintain the edges of frit at a temperature of about 430° C. or more, that is, at the transition temperature Tg of frit. In this case, the temperature of the central part of frit sealed by the central part of the laser beam profile G could rise to a temperature of about 650° C. or more, and thus, excessive heat could be injected and an over-welding state could result.

Small voids present at the central part of frit, to which excessive energy has been irradiated, could expand to be greater than at the edge of fit, and the expanded small voids could leave bubble boiling marks while being rapidly cooled. Such bubble marks could noticeably decrease the strength and adhesion of an organic light-emitting display device.

Residual stress is determined by a coefficient of thermal expansion and the cooled temperature difference. If the central part of frit which has risen to a higher temperature is cooled more slowly than the edge of frit, cracks may appear when tensile stress increases and shock may thus be applied from the outside.

In order to address such a limitation, it may be considered to irradiate the frit with a laser beam having a profile that is homogeneous in beam intensity.

Figure 5:
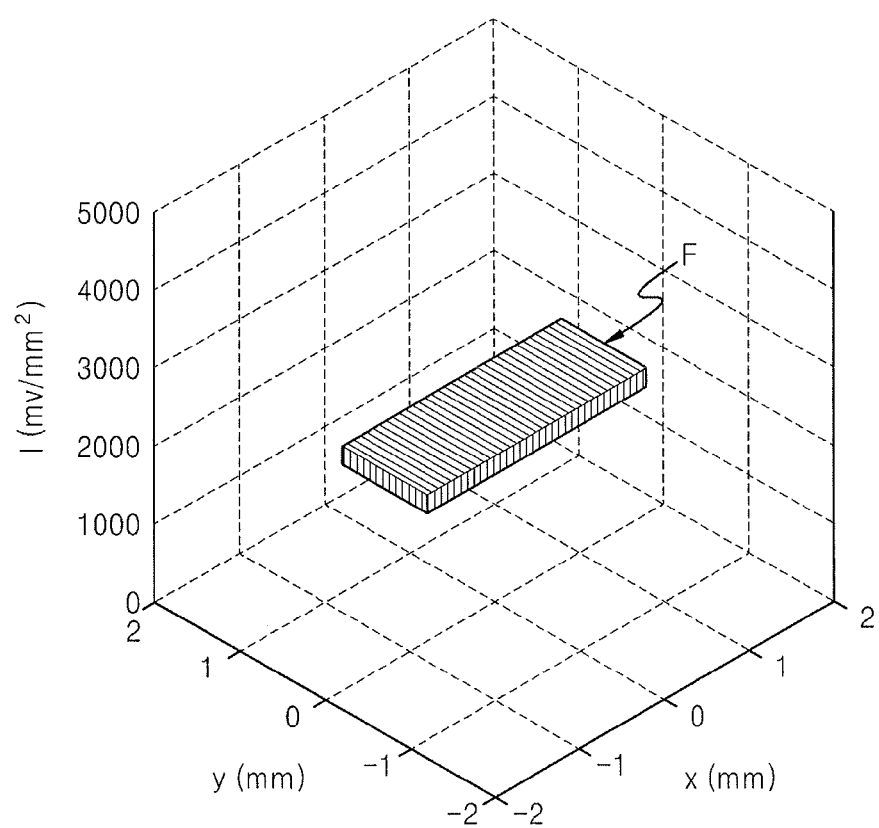
FIG. 5 is a view illustrating a flat top beam profile as a second comparative example for comparison with a beam profile irradiated by an optical system according to the present embodiment.

FIG. 5 is a view illustrating a flat top beam profile as a second comparative example for comparison with a beam profile irradiated by a laser irradiating device according to the present embodiment.

Figure 6:
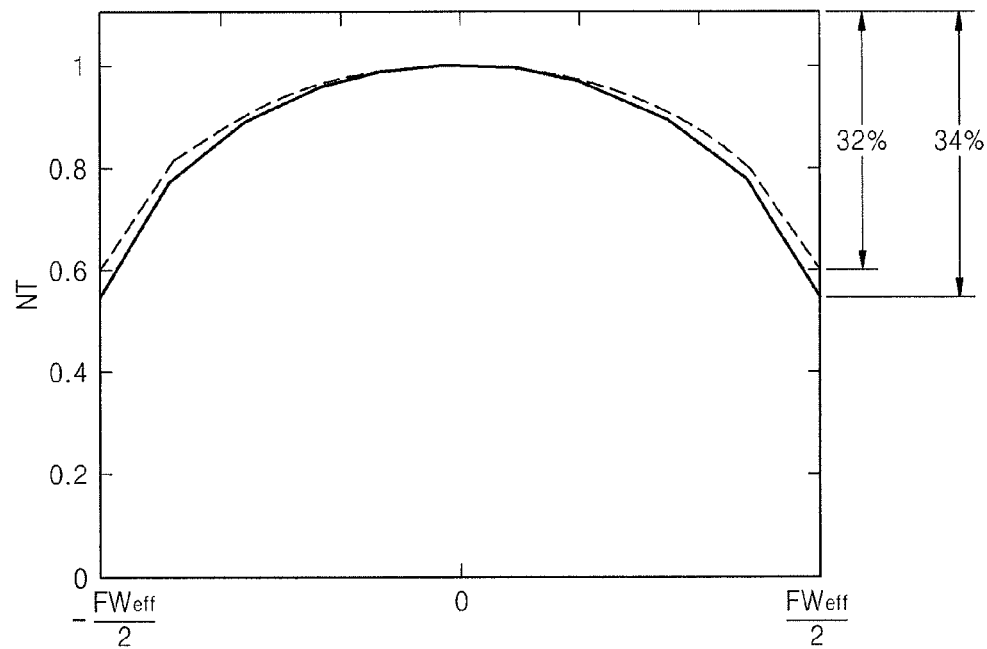
FIG. 6 is a view of a normalized temperature distribution with respect to a section of frit within an effective sealing width ($FW_{eff}$) when irradiating the flat top beam profile of FIG. 5 and the Gaussian beam profile of FIG. 3 to the frit of an organic light-emitting display device.

FIG. 6 is a view of a normalized temperature distribution with respect to a section of frit within an effective sealing width (FW$_{eff}$) when irradiating the flat top beam profile of FIG. 5 (solid line) and the Gaussian beam profile of FIG. 3 (dotted line) to the frit of an organic light-emitting display device.

Referring to FIG. 5, a laser beam profile with a flat top distribution F has a distribution in a brick shape in which the central part of a beam and the peripheral part of the beam are uniform in beam intensity per unit area I.

The horizontal axis of FIG. 6 represents the location of frit within the FW$_{eff}$ and the vertical axis NT of FIG. 6 represents a normalized temperature. Referring to the drawings, it can be seen that even if a flat top laser beam with homogeneous beam intensity F is irradiated to frit, the temperature homogeneity of a section of frit only shows a decrease of about 2% from 34% to 32% compared to the Gaussian profile, and the temperature homogeneity is hardly improved.

The poor improvement may be due to heat going out easily along the edge of fit compared to the central part of frit. Accordingly, in order to address the limitations described above, instead of making the intensity of a laser beam irradiated to frit homogeneous, it may be desirable to make the temperature distribution depending on a section of fit homogeneous after the laser beam has been irradiated. To this end, it may be desirable to supply greater energy to the edge of frit than to the central part of frit.

Figure 7:
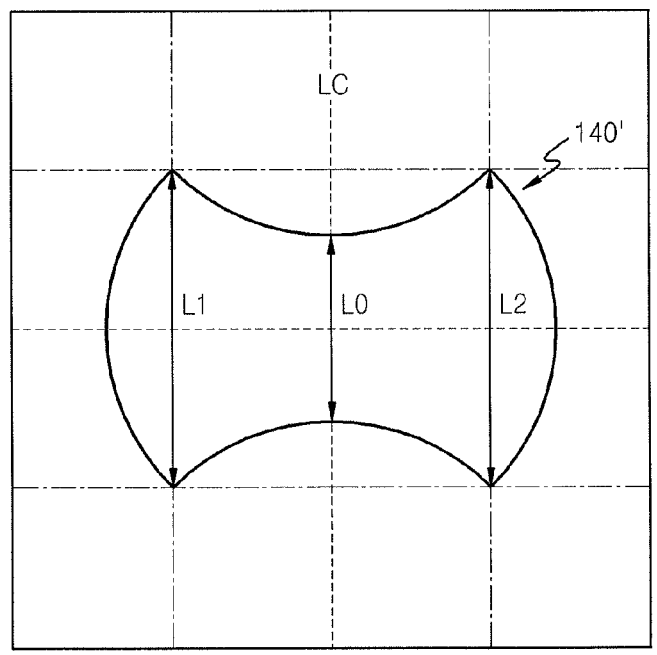
FIG. 7 is a view schematically illustrating a section of a laser beam according to an embodiment.

With reference to FIG. 7, a laser beam profile described below may enhance the temperature distribution homogeneity of a section of frit when sealing substrates with the optical system 1 according to the present embodiment.

FIG. 7 is a view schematically illustrating a section of a laser beam 140' according to an embodiment.

Referring to FIG. 7, the laser beam 140' has an entirely constant beam intensity and has a beam profile in which two opposing sides of its central part are concave symmetrically to the central line LC of a laser beam. In addition, the length of the central part L0 of the laser beam 140' may be formed to be smaller than the lengths of the peripheral parts L1 and L2 of the laser beam parallel to the LC.

Thus, similar to the embodiment described previously, heat flux, which is a time integral value of the intensity of a laser beam irradiated during a scan operation along the central part of a sealing line FL, has a greater value at the edge of the sealing portion 170 than the central part of the sealing portion 170.

Thus, if the laser beam 140 with the beam profile described above is irradiated to the sealing portion 170 of an organic light-emitting display device, greater energy is supplied to the edge of the sealing portion 170 than to the central part of the sealing portion 170 and thus it may be possible to enhance the temperature homogeneity of a section of frit.

An optical system described below may form an above-described beam profile in which two opposing sides are concave, and other various shapes of beam profiles.

FIG. 8 is a view schematically illustrating the optical system 1 according to an embodiment.

The optical system 1 includes an enlarging optical system 110, a mask 120, and a reduction optical system 130. The enlarging optical system 110 enlarges a section of an incident light 115. The mask 120 passes a light passing through the enlarging optical system 110. The reduction optical system 130 reduces a section of a light 123 passing through the mask 120. As a result, a laser beam 140 passing through the reduction optical system 130 may have various shapes of beam profiles depending on the pattern of the mask 120.

The enlarging optical system 110 may include a first lens 111, a first mirror 113, a second mirror 114, and a second lens 112.

A laser light that is generated by a laser oscillator (not illustrated) and passes through the optical fiber 190 enters the first lens 111. The first lens 111 changes an incident light 115 to a parallel light. For example, the first lens 111 may be a convex lens.

The first mirror 113 is arranged on an optical path that passes through the first lens 111, and reflects the parallel light passing through the first lens 111. For example, the first mirror 113 reflects the parallel light passing through the first lens 111 so that the parallel light is perpendicular to a previous direction.

The second mirror 114 is arranged on an optical path that is reflected by the first mirror 113, and reflects the parallel light reflected by the first mirror 113. For example, the second mirror 114 reflects the parallel light reflected by the first mirror 113 so that the parallel light is perpendicular to a previous direction. Thus, the parallel light passing through the first lens 111 is reflected by the first mirror 113 and the second mirror 114 and thus the travelling direction of the light may change to an opposite direction. By arranging the first mirror 113 and the second mirror 114 in this way, the travelling direction of the light changes to an opposite direction and the length of an optical system may thus be decreased.

The second lens 112 makes the parallel light that passes through the first lens 111 and then is reflected by the first mirror 113 and the second mirror 114 form an image on the mask 120. For example, the second lens 112 may be a convex lens. By arranging the mask 120 on the focal length of the second lens 112, it is possible to make the light passing through the second lens 112 form an image on the mask 120.

If a magnification by the enlarging optical system 110 is M, the distance between the optical fiber 190 and the first lens 113 is X1, and the distance between the second lens 112 and the mask 120 is Y1, then the following Equation (1) may be established.

$$M = \frac{Y1}{X1} \quad \text{Equation (1)}$$

Thus, if the diameter of the optical fiber 190 is I0 and the size of an image formed on the mask 120 is I1, the following Equation (2) may be established.

$$I1 = M \times I0 = \left(\frac{Y1}{X1}\right) \times I0 \quad \text{Equation (2)}$$

Thus, the magnification M may be determined based on the distance X1 between the optical fiber 190 and the first lens 113 and the distance Y1 between the second lens 112 and the mask 120. For example, the magnification M may be 6 or more.

The mask 120 includes a pattern of a predefined shape and blocks some of the light enlarged by the enlarging optical system 110. The mask 120 may be formed of metals such as aluminum or tungsten.

Thus, by changing the pattern of the mask 120, the shape of the laser beam 140 irradiated by the optical system 1 may be easily changed. That is, a beam profile of a desired shape may be made by using the mask 120 with various patterns.

As an exemplary embodiment, the light enlarged by the enlarging optical system 110 may have a circular section and the mask 120 may have a pattern in which two opposing sides of its central part are concave symmetrically to the central line of light passing through the mask 120. That is, the opening of the mask 120 may have a shape similar to a section of the laser beam 140' illustrated in FIG. 7. Thus, a section of light passing through the mask 120 may have a shape in which two opposing sides of its central part are concave symmetrically to the central line of light passing through the mask 120. That is, a section of the light passing through the mask 120 may have a shape similar to a section of the laser beam 140' illustrated in FIG. 7.

The mask 120 may be formed to shape, in a predefined pattern, an image whose focal point is formed on the mask 120. If the mask 120 were to block some of the parallel light, relevant images could give rise to diffraction without being transmitted to the surface of frit intact. Thus, by arranging the mask 120 at the focal length of the second lens 112, it is desirable to make light passing through the second lens 112 form an image on the mask 120.

By passing light enlarged by the enlarging optical system 110, through the mask 120, it is possible to decrease the intensity of the light on the surface of the mask 120. Thus, it may be possible to prevent the mask 120 from melting due to the intensity of a laser, which could occur if laser light generated by a laser oscillator (not illustrated) is irradiated to the mask 120 as it is. According to an exemplary embodiment, the laser intensity on the surface of the mask 120 may be about 0.1 W/mm$^2$ to about 1 W/mm$^2$. In this case, the magnification M by the enlarging optical system 110 may be 6 or more. In addition, if there is a need to safely use the mask 120, the magnification M by the enlarging optical system 110 may be 10 or more.

A driving unit 121 is coupled to the mask 120 to rotate the mask 120. As the driving unit 121, a rotary motor may be used, as an example. As a result, it may be possible to easily rotate the laser beam 140 irradiated by the optical system 1 by rotating the mask 120 with the driving unit 121, as well.

The reduction optical system 130 may include a third lens 131, a third mirror 134, a fourth mirror 135, a fourth lens 132, and a final optical unit 133.

A light 123 passing through the mask 120 enters the third lens 131. The third lens 131 changes the light 123 passing through the mask 120, to a parallel light. For example, the third lens 131 may be a convex lens.

The third mirror 134 and the fourth mirror 135 are arranged on an optical path that passes through the third lens 131. The configurations and operations of the first mirror 113 and the second mirror 114 may be similarly applied to the third mirror 134 and the fourth mirror 135.

The fourth lens 132 makes a parallel light that passes through the third lens 131 and is then reflected by the third mirror 134 and the fourth minor 135, form a focal point. For example, the fourth lens 132 may be a convex lens. In addition, the fourth lens 132 may be arranged to be moveable in a direction D parallel to the travelling direction of a light passing through the fourth lens 132. Thus, it is possible to change the location of a focal point that is formed by the fourth lens 132.

The final optical unit 133 reduces a section of a light that passes through the fourth lens 132. That is, the final optical unit 133 may make a light passing through the fourth lens 132 form a focal point on the sealing portion 170. By arranging the sealing portion 170 at the focal length of the final optical unit 133, it is possible to make a light passing through the final optical unit 133 form a focal point on the sealing portion 170.

The final optical unit 133 may include at least three lenses. Preferably, it may include a first concave lens 136, a first convex lens 137, and a second convex lens 138. As described above, if the final optical unit 133 includes a plurality of lenses, it is possible to decrease chromatic aberration and spherical aberration.

As a result, if a rate of reduction by the reduction optical system 130 is M', the distance between a point with a focal point formed by the fourth lens 132 and the final optical unit 133 is X2, and the distance between the final optical unit 133 and the sealing portion 170 is Y2, then the following Equation (3) may be established.

$$I1 = M \times I0 = \left(\frac{Y1}{X1}\right) \times I0 \qquad \text{Equation (3)}$$

Thus, if the size of an image where a focal point is formed by the fourth lens 132 is I2 and the size of an image formed on the sealing portion 170 is I3, then the following Equation (4) may be established.

$$I3 = M' \times I2 = \left(\frac{Y2}{X2}\right) \times I2 \qquad \text{Equation (4)}$$

Thus, the rate of reduction M' may be determined on the basis of a ratio of the distance X2 between a point with a focal point formed by the fourth lens 132 and the final optical unit 133, to the distance Y2 between the final optical unit 133 and the sealing portion 170.

The fourth lens 132 may change the location of a focal point formed by the fourth lens 132, by being arranged to be moveable in the direction D parallel to the travelling direction of a light passing through the fourth lens 132. Thus, it is possible to adjust the distance X2 between a point with a focal point formed by the fourth lens 132 and the final optical unit 133, through the movement of the fourth lens 132. For example, if the distance X2 between a point with a focal point formed by the fourth lens 132 and the final optical unit 133 increases by the upward movement of the fourth lens 132, the rate of reduction M' decreases on the assumption that the distance Y2 between the final optical unit 133 and the sealing portion 170 is constant. Thus, the size of an image formed on the sealing portion 170 decreases.

In particular, in the optical system 1 according to an embodiment, the diameter IO of the optical fiber 190 may be about 1.2 mm, the magnification M may be about 6, and the length of the optical system may be approximately less than 1 m if the size I3 of an image formed on the sealing portion 170 is about 3.5 mm. In this case, the size I1 of an image formed on the mask 120 is about 7.2 mm and the intensity of a light on the surface of the mask 120 is about 1 W/mm².

As an exemplary embodiment, a section of a light passing through the mask 120 may have a shape similar to a section of a laser beam 140' illustrated in FIG. 7 and thus, a section of a light 140 passing through the reduction optical system 130 may have a shape similar to a section of a laser beam 140' illustrated in FIG. 7.

If a light passing through the optical system according to embodiments is irradiated to the frit of an organic light-emitting display device, it is possible to enhance the strength and adhesion of the organic light-emitting display device.

By way of summation and review, an organic light-emitting display device may experience a short life cycle, low light-emitting efficiency, and deformation in color of an emitted light due to the oxidation and peeling-off of electrode materials, if moisture or oxygen from a surrounding environment flows into the device.

Thus, in manufacturing an organic light-emitting display device, a sealing process is typically performed to isolate the organic light-emitting device from the outside so that moisture does not penetrate into the device. Typical examples of such a sealing process include a method of laminating inorganic thin films and organic polymers such as polyester (PET) on a second electrode of an organic light-emitting display device and a method of forming a moisture absorbent in an encapsulation substrate, filling the encapsulation substrate with nitrogen gases, and sealing the edge of the encapsulation substrate with a sealant such as epoxy.

These methods however may not completely block light-emitting device destroying factors, such as moisture or oxygen from coming from the outside. Accordingly, these methods may not be suitable to apply to an organic light-emitting device that is vulnerable particularly to moisture. In addition, complex processes may be required to carry out these methods. In order to address such issues, a substrate sealing method has been devised that enhances adhesion between an organic light-emitting device substrate and an encapsulation substrate by using frit as a sealant.

By using a structure in which frit is coated on a glass substrate to seal an organic light-emitting display device, it may be possible to protect the organic light-emitting display device more effectively because of complete sealing between the organic light-emitting device substrate and the encapsulation substrate.

For the method of sealing substrates with frit, frit is coated on the sealing portion of each organic light-emitting display device, and laser beams are irradiated to the sealing portion while the laser beam irradiating device moves, thereby curing the fit, and thus, sealing the substrate.

Embodiments disclosed herein provide an optical system that may form a beam profile to a desired shape, and a method of sealing substrates by using the same.

Since elements shown in the accompanying drawings may be scaled up or down for convenience in description, embodiments are not constrained to the size or shape of those shown in the drawings. In addition, it is to be understood by those of ordinary skill in the art that various changes in form and details may be made therein without departing from the spirit and scope thereof as defined by the following claims.

What is claimed is:

1. A method of sealing a first and a second substrate by irradiating light to a sealing portion arranged between the first and second substrates, the method comprising:

disposing the sealing portion between the first and second substrates;

enlarging a section of an incident light;

passing light with an enlarged section through a mask;

reducing a section of light that has passed through the mask with a reduction optical system; and irradiating light that has passed through the reduction optical system along a sealing line of the sealing portion.

2. The method of claim 1, wherein the intensity of light on a surface of the mask is in a range of about 0.1 W/mm$^2$ to about 1 W/mm$^2$.

3. The method of claim 1, wherein light that has passed through the reduction optical system is irradiated to the sealing portion in the form of a spot beam.

4. The method of claim 1, wherein the enlarging of the section of the incident light includes:

changing the incident light to a parallel light;

reflecting the parallel light; and making the reflected parallel light form an image on the mask.

5. The method of claim 1, further comprising rotating the mask.

6. The method of claim 1, wherein the reducing of the section of light that has passed through the mask includes:

changing the light passing through the mask to a parallel light;

reflecting the parallel light;

making the reflected parallel light form a focal point through a lens; and reducing a section of light passing through the lens.

7. The method of claim 6, further comprising moving the lens in a direction parallel to the traveling direction of the light passing through the lens.

8. The method of claim 1, wherein after focusing a central line of a light passing through the reduction optical system, on a central line of the sealing line, scanning is performed along the central line of the sealing portion to irradiate a light passing through the reduction optical system.

9. The method of claim 1, wherein a width LW of a light passing through the reduction optical system is greater than a width of the sealing portion.

10. The method of claim 3, wherein the sealing portion comprises a frit.

* * * * *